United States Patent
Bian et al.

(10) Patent No.: US 6,936,541 B2
(45) Date of Patent: Aug. 30, 2005

(54) METHOD FOR PLANARIZING METAL INTERCONNECTS

(75) Inventors: Jinru Bian, Newark, DE (US); Tirthankar Ghosh, Oreland, PA (US); Terence M. Thomas, Newark, DE (US)

(73) Assignee: Rohn and Haas Electronic Materials CMP Holdings, Inc., Wilmington, DE (US)

( * ) Notice: Subject to any disclaimer, the term of this patent is extended or adjusted under 35 U.S.C. 154(b) by 284 days.

(21) Appl. No.: 10/402,168

(22) Filed: Mar. 28, 2003

(65) Prior Publication Data

US 2004/0023492 A1 Feb. 5, 2004

Related U.S. Application Data

(63) Continuation-in-part of application No. 10/043,664, filed on Oct. 26, 2001, now Pat. No. 6,605,537, which is a continuation-in-part of application No. 09/956,680, filed on Sep. 20, 2001, now abandoned.
(60) Provisional application No. 60/243,973, filed on Oct. 27, 2000, and provisional application No. 60/233,818, filed on Sep. 20, 2000.

(51) Int. Cl.[7] .......................................... H01L 21/302
(52) U.S. Cl. ...................... 438/691; 438/692; 438/693; 438/694; 438/697; 438/700
(58) Field of Search .................................. 438/691, 692, 438/693, 694, 697, 700

(56) References Cited

U.S. PATENT DOCUMENTS

| | | | | |
|---|---|---|---|---|
| 6,303,049 | B1 * | 10/2001 | Lee et al. | 252/79.1 |
| 6,326,299 | B1 * | 12/2001 | Homma et al. | 438/633 |
| 6,348,076 | B1 * | 2/2002 | Canaperi et al. | 51/309 |
| 6,436,811 | B1 * | 8/2002 | Wake et al. | 438/633 |
| 6,561,875 | B1 * | 5/2003 | Homma et al. | 451/41 |
| 6,620,725 | B1 * | 9/2003 | Shue et al. | 438/633 |
| 6,774,041 | B1 * | 8/2004 | Kondo et al. | 438/692 |

* cited by examiner

Primary Examiner—Nadine G. Norton
Assistant Examiner—Binh X. Tran
(74) Attorney, Agent, or Firm—Blake Biederman

(57) ABSTRACT

A method for planarizing metal interconnects of a semiconductor wafer includes the steps of polishing the semiconductor wafer with a polishing solution and a polishing pad to planarize the metal interconnects. The polishing solution has by weight percent, 0.15 to 5 benzotriazole, 0 to 1 abrasive, 0 to 10 polymeric particles, 0 to 5 polymer-coated particles and balance water at a pH of less than 5 and a removal rate-pressure sensitivity ($d_r/d_p$) of at least 750 (Å/min/psi). The polishing simultaneously accelerates removal of projecting metal from the metal interconnects with the polishing pad providing a first pressure that increases removal rate of the projecting metal; and it inhibits removal of recessed metal from the metal interconnects with the polishing pad providing a second pressure that decreases removal of the recessed metal.

10 Claims, 1 Drawing Sheet

METHOD FOR PLANARIZING METAL INTERCONNECTS

CROSS-REFERENCES TO RELATED APPLICATIONS

This is a continuation-in-part of application Ser. No. 10/043,664, filed Oct. 26, 2001 now U.S. Pat. No. 6,605,537, which is a is a continuation-in-part of application Ser. No. 09/956,680, filed on Sep. 20, 2001, now abandoned, and claims the benefit of Provisional Application Ser. No. 60/243,973, filed on Oct. 27, 2000, and claims the benefit of Provisional application Ser. No. 60/233,818, filed Sep. 20, 2000.

BACKGROUND

The invention relates to a method for polishing a semiconductor substrate by chemical mechanical planarization (CMP) to planarize metal interconnects.

CMP is used to planarize semiconductor substrates. In CMP, a polishing pad is pressed against the substrate and is moved across the surface of the substrate while an aqueous liquid polishing composition (also referred to as slurry) is provided between the polishing pad and the substrate. The CMP process is a combination of chemical action and mechanical action. Chemicals in the polishing composition carry out the chemical action while the necessary mechanical action is provided by the movement of the substrate against the polishing pad. Abrasive particles when present in the polishing slurry enhance the mechanical action. An oxidizer when present in the composition converts the metal on the substrate to oxide that is then removed by movement of the substrate against the polishing pad. A metal oxide sometimes serves as an element of a passivating layer. Thus formation of the metal oxide layer reduces the rate of metal removal during the polishing process.

A known polishing process by CMP removes excess metal from an underlying surface of the substrate, and polishes such surface to a smooth planar surface. The known polishing operation begins by polishing with a relatively high polishing pressure, for example, 5 psi, to remove excess metal at a relatively high removal rate, followed by polishing with a relatively reduced polishing pressure, for example, 3 psi, to remove a residual thin film of the excess metal from an underlying surface, and to polish the surface to a smooth polished planar surface.

Copper is a relatively soft metal in comparison to the substrate of the semiconductor wafer that usually is silica or another similar hard substrate. By using conventional polishing equipment and techniques, a copper line forming a copper circuit on a patterned wafer is typically polished more in the center than on the edges. This phenomenon is commonly known as dishing.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. There is a requirement for a method to planarize semiconductor wafers' metal interconnects that provides effective metal removal rates and reduces the interconnects' dishing.

STATEMENT OF THE INVENTION

The invention is a method for planarizing metal interconnects of a semiconductor wafer comprising the steps of: a) polishing the semiconductor wafer with a polishing solution and a polishing pad to planarize the metal interconnects, the metal interconnects being a nonferrous metal selected from the group consisting of copper, copper-base alloys, silver and silver-base alloys and the polishing solution having by weight percent, 0.15 to 5 benzotriazole, 0 to 1 abrasive, 0 to 10 polymeric particles, 0 to 5 polymer-coated particles and balance water at a pH of less than 5 and a removal rate-pressure sensitivity ($d_r/d_p$) of at least 750 (Å/min/psi); b) accelerating removal of projecting metal from the metal interconnects with the polishing pad providing a first pressure that increases removal rate of the projecting metal; and c) inhibiting removal of recessed metal from the metal interconnects with the polishing pad providing a second pressure that decreases removal of the recessed metal and wherein the accelerating and inhibiting steps occur in a simultaneous manner.

DETAILED DESCRIPTION

Figure 1:
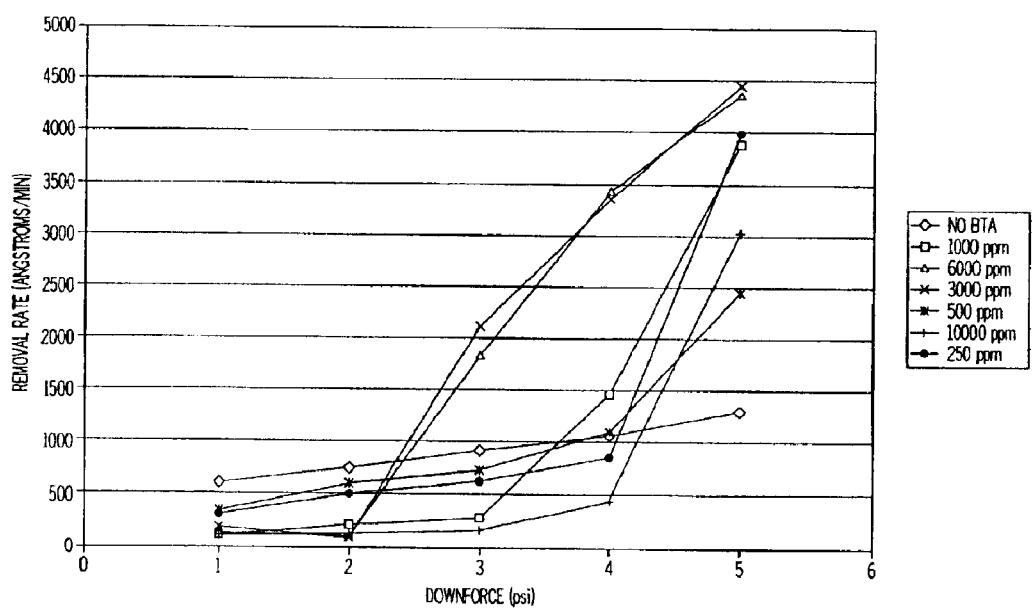
FIG. 1 is a graph disclosing the rate at which metal is removed (Removal rate) as a function of polishing pressure (or downforce) during the CMP process.

The method incorporates a combination of a polishing solution having a removal rate-pressure sensitivity and polishing in a simultaneous manner with at least two polishing pressures. This method planarizes semiconductor wafers' metal nonferrous interconnects in an efficacious manner by using BTA in a manner contrary to its typical use as an inhibitor. In particular, benzotriazole (BTA) functions to: 1) accelerate projecting metal removal rate to remove high regions from metal interconnects; and 2) inhibit removal of recessed metal to decrease removal of the recessed metal and to reduce the interconnects' dishing. The nonferrous metal interconnects include: copper, copper-base alloys, silver and silver-base alloys.

The method provides a first-step polishing operation to planarize metal interconnects. In particular, the method accelerates removing projecting metal or high regions. For purposes of the specification, "accelerating" projecting metal removal refers to the BTA contributing to the removal rate of the metal interconnects. In addition, the method inhibits the removal of recessed metal or low regions created from the metal-filled trenches of semiconductor wafers. For purposes of the specification, "inhibiting" recessed metal removal refers to the method of polishing low regions of the metal interconnects at a lower rate than high regions of the metal interconnects or planarizing. The polishing pad applies greater or first pressure to the projecting metal or high regions than to the lower or second pressure to the recessed metal or low regions, typically located directly above metal trenches. This pressure differential in combination with the removal rate-pressure sensitivity of the solution combines to render the solution effective for planarizing. This planarizing process continues until the wafer's surface no longer contains significant metal recesses or dishing. Then, after completing the initial planarizing, a chip manufacturer can remove residual copper with a different polishing solution. Alternatively, the method may follow a first-step polishing process that removes a top layer of the metal interconnects. Under these circumstances, the process acts to provide a finish planarization of the interconnects. The finishing planarization of the metal interconnect polishing can also employ the same or a reduced pressure to remove residual nonferrous metal from the metal interconnects.

Optionally, the method includes the additional step of finishing the metal interconnect polishing at a reduced pressure with the same polishing solution to remove residual nonferrous metal from the metal interconnects. Reducing the pressure during the finishing polishing serves to further limit scratching and reduce dishing. This "finish" polishing step allows the "reactive liquid" polishing composition to serve as an initial first-step solution and then as a second-step polishing solution to remove residual metal, such as copper.

The polishing solution having a removal rate-pressure sensitivity facilitates effective planarization of the nonferrous interconnects. For purposes of this specification, removal rate-pressure sensitivity is the derivative of the removal rate with respect to pressure ($d_r/d_p$) as measured by change in removal rate of angstroms per minute per psi unit of pressure change. A removal rate pressure sensitivity of at least 750 (Å/min/psi) provides effective planarization. Advantageously, the removal rate pressure sensitivity is at least 1,000 (Å/min/psi) to further promote planarization. Most advantageously, this selectivity is at least 1,500 (Å/min/psi) to increase the method's planarizing propensity.

The polishing solution contains 0.15 to 5 weight percent benzotriazole to promote selective interconnect removal rates. This specification reports all concentrations in weight percent, unless specifically indicated to be in parts per million (ppm); and ppm represents parts per million by weight. Most advantageously, the slurry contains 0.2 to 2 weight percent benzotriazole that accelerates and inhibits removal of the nonferrous metal. Advantageously, the polishing solution requires the BTA to contribute the majority of the polishing solution's copper removal rate. Although not expected to further accelerate metal removal, it is possible to include additional inhibitors in the polishing solution, such as, tolytriazole, imidazole and other azole compounds.

Optionally, the solution contains 0 to 20 weight percent oxidizer for the nonferrous metal. Advantageously, the optional oxidizer is in the range of 0 to 10 weight percent. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, Cu salts, chromium salts, cobalt salts, halogens hypochlorites and mixtures thereof. Furthermore, it is often advantageous to use a mixture of oxidizer compounds. The most advantageous polishing solution includes a hydrogen peroxide oxidizing agent. When the polishing slurry contains an unstable oxidizing agent such as, hydrogen peroxide, it is often most advantageous to mix the oxidizer into the slurry at the point of use.

In addition, the solution may optionally contain 0 to 20 weight percent complexing agent for the nonferrous metal. The complexing agent, when present, prevents precipitation of the metal ions formed by dissolving the nonferrous metal interconnects. Most advantageously, the solution contains 0 to 10 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, salts and mixtures thereof. Advantageously, the complexing agent is selected from the group consisting of acetic acid, citric acid, ethyl acetoacetate, glycolic acid, lactic acid, malic acid, oxalic acid and mixtures thereof. Most advantageously, the complexing agent is citric acid, malic acid or a combination thereof.

The polishing solution contains 0 to 1 weight percent abrasive to limit scratching and dishing of the interconnects. Advantageously, the polishing solution contains 0 to 0.5 weight percent abrasive to further limit scratching and dishing. Typical abrasives include diamond particles and metal oxides, borides, carbides and nitrides and mixture thereof. Most advantageously, if present, the abrasive is selected from the group consisting of alumina, ceria and silica and mixtures thereof. Although the solution is effective with zero concentration levels of abrasive, a small amount of abrasive facilitates polishing debris removal. To limit scratching, the solution advantageously contains abrasives having an average particle size of less than 200 nm and most advantageously, an average particle size less than 100 nm.

For debris removal, the solution may optionally contain 0 to 10 weight percent polymeric particles. These soft particles facilitate debris removal, but inflict minimal scratching of the nonferrous interconnects. Advantageously, the polishing solution contains 0 to 5 weight percent polymeric particles. These polymeric particles optionally have an average particle size less than 250 nm.

In addition, the solution may optionally contain 0 to 5 weight percent polymer-coated particles. These semi-soft particles facilitate debris removal, but inflict decreased scratching of the nonferrous interconnects. Advantageously, the polishing solution contains 0 to 2.5 weight percent polymer-coated particles. Surfactants or polymers such as polyvinylpyrrolidone can bond to abrasives to provide the polymer-coated particles. These polymeric particles optionally have an average particle size less than 150 nm.

The aqueous polishing solution contains a balance of water and accelerates removal of the metal interconnect at a pH of less than 5. Advantageously, the method occurs at a pH of less than 4. Most advantageously, the method occurs at a pH of 2 to 3.5. Typically, an inorganic acid reduces the pH of the polishing solution. These inorganic acids include the following: nitric acid, sulfuric acid, hydrochloric acid, phosphoric acid and mixtures thereof. The most advantageous pH adjusting agent is nitric acid ($HNO_3$).

In addition, the method advantageously includes the step of leveling the metal interconnects with a chloride. This optional step relies upon a chloride leveler such as, ammonium chloride, to control surface finish of the interconnect metal. In addition to this, the solution optionally may contain a biocide for limiting biological contamination. For example, Neolone™ M-50 biocide 2-Methyl-4-isothiazolin-3-one in propylene glycol (Rohm and Haas Company) provides an effective biocide for many applications. Furthermore, aqueous polymers such as polyacrylic acid, carboxymethylcellulose and mixtures thereof can further limit dishing of the metal interconnects.

EXAMPLE

This experiment measured removal rates of copper interconnects with the multiple variables of pressure and BTA concentration. A Strausbaugh polishing machine using an IC1000 microporous polyurethane polishing pad (Rodel, Inc.) with a polishing solution flow rate of 250 ml/min, a platen speed of 93 RPM and a carrier speed of 87 RPM planarized the samples. The polishing solutions had of pH=3 adjusted with the use of $HNO_3$ and all solutions contained deionized water. In addition, polishing solutions contained no abrasive, but included: 9 weight percent $H_2O_2$, 0.2 weight percent malic acid, 0.2 weight percent polyacrylic acid having a molecular weight of 250, 0.01 weight percent Neolone™ M-50 biocide 2-Methyl-4-isothiazolin-3-one in propylene glycol and 0.01 weigh percent ammonium chloride brightener.

The following Table provides copper removal rates in angstroms per minute at various pressures and BTA Concentrations.

TABLE

| Down Force | BTA Concentration (ppm) | | | | | | |
|---|---|---|---|---|---|---|---|
| (psi) | 0 | 250 | 500 | 1,000 | 3,000 | 6,000 | 10,000 |
| 1 | 599 | 318 | 343 | 117 | 186 | 108 | 122 |
| 2 | 740 | 499 | 595 | 216 | 130 | 125 | 98 |
| 3 | 901 | 608 | 720 | 281 | 2109 | 1825 | 149 |
| 4 | 1047 | 829 | 1079 | 1448 | 3367 | 3443 | 425 |
| 5 | 1277 | 3978 | 2439 | 3881 | 4433 | 4348 | 3027 |

FIG. 1 plots the data of Table 1 to illustrate removal rate-pressure sensitive combinations of BTA and pressure useful for planarizing metal interconnects.

The method planarizes semiconductor wafers' metal interconnects in a manner that provides effective metal removal rates and reduces the interconnects' dishing. This method relies upon the simultaneous dual function of BTA to planarize metal interconnections, such as copper. These dual functions consist of accelerating the removal of projecting metal or high regions and inhibiting the removal of recessed regions in a manner that planarizes metal interconnects.

What is claimed is:

1. A method for planarizing metal interconnects of a semiconductor wafer comprising the steps of:
    a) polishing the semiconductor wafer with a polishing solution and a polishing pad to planarize the metal interconnects, the metal interconnects being a nonferrous metal selected from the group consisting of copper, copper-base alloys, silver and silver-base alloys and the polishing solution having by weight percent, 0.15 to 5 benzotriazole, 0 to 1 abrasive, 0 to 10 polymeric particles, 0 to 5 polymer-coated particles and balance water at a pH of less than 5 and a removal rate-pressure sensitivity $d_r/d_p$ of at least 750 Å/min/psi;
    b) accelerating removal of projecting metal from the metal interconnects with the polishing pad providing a first pressure that increases removal rate of the projecting metal; and
    c) inhibiting removal of recessed metal from the metal interconnects with the polishing pad providing a second pressure that decreases removal of the recessed metal and wherein the accelerating and inhibiting steps occur in a simultaneous manner.

2. The method of claim 1 wherein the polishing follows a first-step polishing step that removes a top layer of the metal interconnects.

3. The method of claim 1 including the additional step of finishing the metal interconnects by polishing at a reduced pressure with the polishing solution of step a) to remove residual nonferrous metal from the metal interconnects.

4. The method of claim 1 wherein the polishing solution has a removal rate-pressure sensitivity of least 1,000 Å/min/psi to reduce dishing of the metal interconnects during the polishing.

5. The method of claim 1 including the additional step of complexing the nonferrous metal removed from the metal interconnects.

6. A method for planarizing metal interconnects of a semiconductor wafer comprising the steps of:
    a) polishing the semiconductor wafer with a polishing solution and a polishing pad to planarize the metal interconnects, the metal interconnects being a nonferrous metal selected from the group consisting of copper, copper-base alloys, silver and silver-base alloys and the polishing solution having by weight percent, 0.2 to 2 benzotriazole, 0 to 20 oxidizer, 0 to 20 complexing agent, 0 to 0.5 abrasive, 0 to 5 polymeric particles, 0 to 2.5 polymer-coated particles and balance water at a pH of less than 4 and a removal rate-pressure sensitivity $d_r/d_p$ of at least 1000 Å/min/psi;
    b) accelerating removal of projecting metal from the metal interconnects with the polishing pad providing a first pressure that increases removal rate of the projecting metal; and
    c) inhibiting removal of recessed metal from the metal interconnects with the polishing pad providing a second pressure that decreases removal of the recessed metal and wherein the accelerating and inhibiting steps occur in a simultaneous manner.

7. The method of claim 6 wherein the polishing follows a first-step polishing step that removes a top layer of the metal interconnects.

8. The method of claim 6 including the additional step of finishing the metal interconnects by polishing at a reduced pressure with the polishing solution of step a) to remove residual nonferrous metal from the metal interconnects.

9. The method of claim 6 wherein the nonferrous is selected from the group consisting of copper and copper-base alloys and the polishing solution has a removal rate-pressure sensitivity of least 1,500 Å/min/psi to reduce dishing of the metal interconnects during the polishing.

10. The method of claim 6 including the additional step of complexing the nonferrous metal removed from the metal interconnects.

* * * * *